United States Patent [19]
George

[11] 3,961,263
[45] June 1, 1976

[54] BANDSTART DETECTOR SYSTEM FOR A TELEVISION TUNING SYSTEM

[75] Inventor: John Barrett George, Indianapolis, Ind.

[73] Assignee: RCA Corporation, New York, N.Y.

[22] Filed: June 3, 1974

[21] Appl. No.: 476,086

[52] U.S. Cl. ................................ 325/421; 325/464
[51] Int. Cl.² .......................................... H04B 1/16
[58] Field of Search ........................... 325/421–423, 325/418–420, 464, 470, 458–460, 462; 331/2, 4, 19, 40, 179; 328/134; 334/13, 16, 18; 178/DIG. 15, 7.3 R

[56] References Cited
UNITED STATES PATENTS

| | | | |
|---|---|---|---|
| 3,427,561 | 2/1969 | Hamer | 331/179 X |
| 3,641,434 | 2/1972 | Yates et al. | 325/421 X |
| 3,798,553 | 3/1974 | Sakamoto | 325/421 X |
| 3,818,353 | 6/1974 | Sakamoto | 325/422 X |
| 3,824,475 | 7/1974 | Pflasterer | 325/459 X |
| 3,835,248 | 9/1974 | Harford | 178/7.3 R |

*Primary Examiner*—George H. Libman
*Assistant Examiner*—Robert Hearn
*Attorney, Agent, or Firm*—Eugene M. Whitacre; Kenneth R. Schaefer

[57] ABSTRACT

A bandstart detector system for a television receiver tuning system wherein a sample of oscillator signals utilized for conversion of radio frequencies into intermediate frequencies is coupled to a plurality of tuned circuits. Detecting means are coupled to each of the tuned circuits to produce control signals having an amplitude inversely related to the difference between the oscillator signal frequency and the resonant freqency of each of the tuned circuits. The amplitude of the control signal will vary as the oscillator signal frequency is swept in a regular manner through a predetermined band of frequencies corresponding to television channel frequency allocations. The control signals are coupled to a sensing circuit which produces one output signal when the control signal is below a predetermined level and a second output signal when the control signal is above a predetermined level. The output signals produced by the sensing circuit are utilized to initiate counting of pulses, each produced as a result of a frequency comparison of a plurality of harmonically related frequency samples with a regularly recurring variation of the oscillation frequency. The resultant pulses are allowed to be accumulated in a counter employed to identify the channel being received.

3 Claims, 2 Drawing Figures

BANDSTART DETECTOR SYSTEM FOR A TELEVISION TUNING SYSTEM

BACKGROUND OF THE INVENTION

This invention relates to a television tuning system and more particularly to a system for enabling a counter which identifies the channel to which a radio frequency tuner is tuned.

A tuning system which provides for the selection of any one of a plurality of television channels in, for example, three bands of radio frequencies is disclosed in my copending application Ser. No. 476,081, now U.S. Pat. No. 3,924,192, filed concurrently herewith and entitled, "Random Channel Address Crystal-Lock Tuning System." To access a given channel, an oscillator of an appropriate tuner for tuning one of the three radio frequency bands is swept throughout a band of oscillator frequencies. As the oscillator is swept, the oscillator signal is compared to a plurality of harmonically related frequency samples which are spaced apart by a frequency related to a regular channel spacing. A counter accumulates a count representative of the number of frequency comparison conditions encountered during a period of sweeping of the oscillator. To obtain an accurate count in the counter, a counter enable system is provided to allow the counts to begin entering the counter only after reaching a predetermined point in the sweeping process.

One approach which has been suggested to establish the point at which the counter will start to accumulate counts during the sweeping process involves providing a reference voltage which is compared to the voltage generated to tune the oscillator of the tuner. When the generated voltage is equal to or has a fixed relationship to the reference voltage, the counter is enabled and counts are accumulated therein. With such a system, the reference voltage must be adjusted individually in each receiver to accommodate the variations in tuning voltage versus frequency characteristics from tuner to tuner. Also, the variations of tuner frequency tuning voltage versus frequency characteristics with temperature change must be carefully controlled to prevent inaccurate accumulation of counts in the counter caused by a shift in temperature in the environment of the tuner.

SUMMARY OF THE INVENTION

In accordance with the present invention, a channel enabling system is provided for a television tuning system wherein any one of a plurality of television channels in at least a first band of radio frequencies can be selected. Access to a channel is accomplished by sweeping an oscillator of a tuner through at least a second band of frequencies. The channel to be accessed is identified by comparing a signal from the oscillator with a plurality of harmonically related frequency samples at least some of which are within the second band of frequencies. A count is accumulated in a counter which is representative of the number of predetermined frequency comparison conditions encountered during a period of sweeping of the oscillator. The system in accordance with the invention for enabling the counter has a first means coupled to the oscillator for developing a control signal having a magnitude which is related to the frequency difference between the signal from the oscillator and a predetermined frequency near the beginning of the band to be swept. A second means is coupled to the first mens and is responsive to the control signal and provides a first output signal for magnitudes of the control signal below a threshold magnitude and second output signal at magnitudes of the control signal above the threshold. A third means couples the second means to the counter to enable the counter upon a transition between the first output signal and the second output signal.

BRIEF DESCRIPTION OF THE DRAWINGS

Other aspects of the invention will be more readily apparent from a consideration of the following description when taken in connection with the accompanying drawings, in which.

DETAILED DESCRIPTION OF THE DRAWINGS

While the invention is useful in the case of tuning systems employing various frequency allocations, it will be described in only one such context (the channel allocations employed in the United States) in order to avoid unduly complicating the description.

Figure 1:
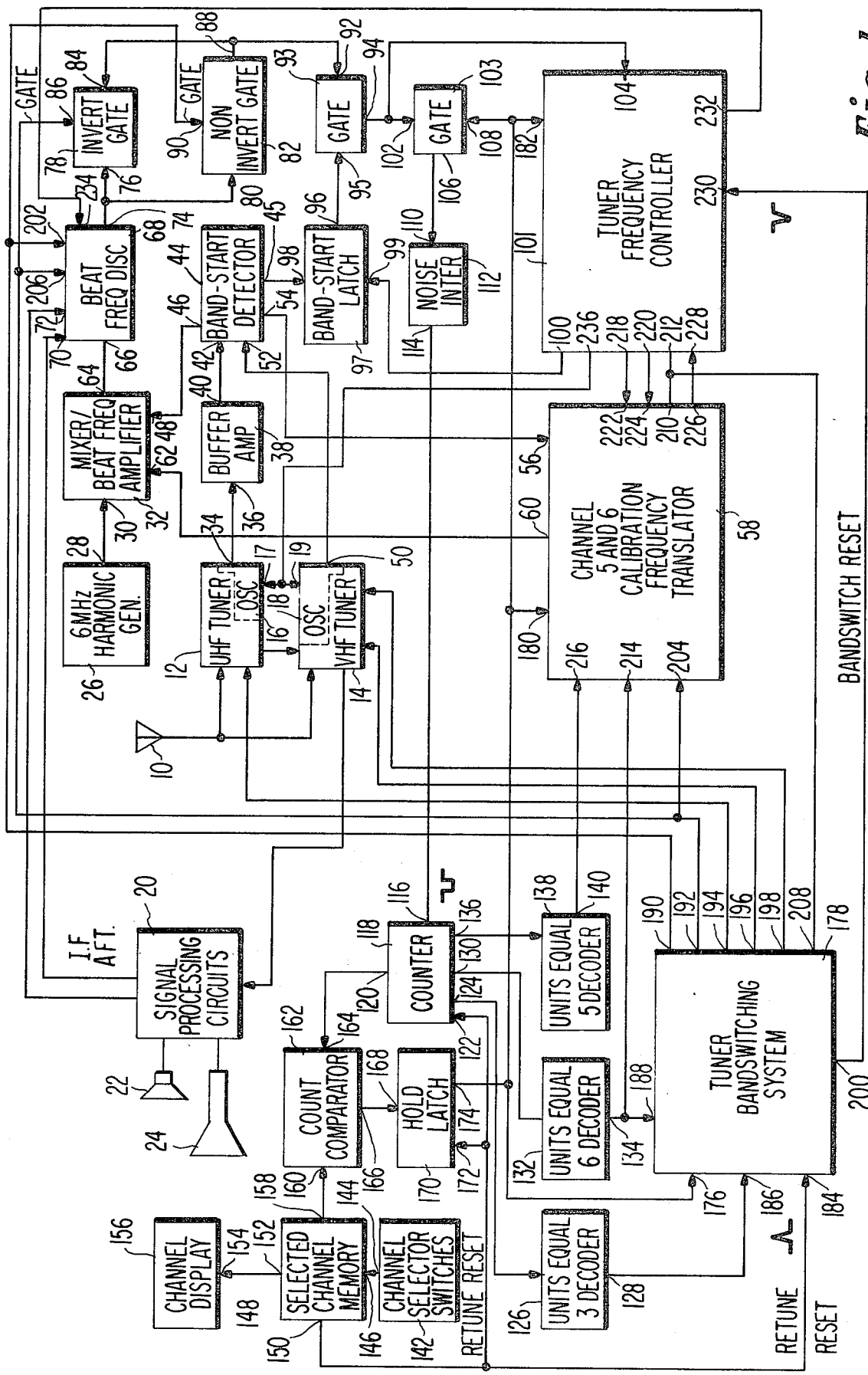
FIG. 1 illustrates in block form a television receiver including a tuning system incorporating the present invention.

Referring to FIG. 1, a television receiver system is shown in block form. Stated in general terms, the system of FIG. 1 incorporates a tuning arrangement which selects a channel to be received by entering a two digit channel number into a memory by the use of momentary closure of switches. At the completion of the entry of the channel number, the tuning system automatically is reset to an initial condition which initiates a sequential sweep of the tuner oscillators through a sequence of bands such as the low VHF band, the high VHF and the UHF band until the selected channel is being received by the television receiver system. An identification of the channel being tuned at any period during the scan is provided by data accumulated in a counter. A counter is advanced by pulses formed by comparing the output of the oscillator which is being swept with a plurality of frequency samples spaced apart according to a regular spacing of television channel frequencies (e.g., 6 MHz).

A detailed description of FIG. 1 is as follows. Channel numbers are entered into the tuning system of the television receiver by means of channel selector switches 142 which may, for example, be an arrangement of the type used in small electronic calculating machines. As each digit of the channel number is entered, the data is transferred to a selected channel memory 148. The data held in memory 148 is coupled to a channel display 156. Upon the completion of a selection of the second digit of a channel number, a reset pulse is generated by the selected channel memory 148 and is coupled to a terminal 122 of a counter 118, a terminal 72 of a hold latch 170, and to a terminal 184 of a tuner bandswitching system 178. The reset pulse applied to the terminal 122 of counter 118 provides a reset of the counter 118 to an initial (e.g., "00") count state. The reset pulse applied to the terminal 172 of hold latch 170 provides for an initial condition (e.g., zero volts) at a terminal 174 of hold latch 170. The reset pulse applied to the terminal 184 of tuner bandswitching system 178 provides for a reset of the tuner bandswitching system 178 to a first tuning band (e.g., the low VHF band) and produces a bandswitch reset pulse at a terminal 200 which is coupled to a terminal 230 of a tuner frequency controller 101. The bandswitch reset pulse applied to tuner frequency controller 101 resets the voltage at a terminal 236 of the tuner frequency controller to an initial condition (e.g., zero volts) and produces a reset pulse at a terminal 100 of the tuner frequency controller 101 which, in turn, is coupled to a terminal 99 of a bandstart latch 97. The reset pulse on the terminal 99 of bandstart latch 97 provides for an initial state (e.g., zero volts) at a terminal 96 which is coupled to the terminal 95 of a gate 93 so as to prevent signal flow between a terminal 92 and a terminal 94 of the gate 93.

The terminal 174 of hold latch 170 is coupled to a terminal 176 of tuner bandswitching system 178, to a terminal 180 of a channel 5 and 6 calibration frequency translator 58, to a terminal 108 of a gate 103, and a terminal 182 of the tuner frequency controller 101. With the zero voltage condition supplied by hold latch 170 to the terminal 108 of gate 103, signal can flow between a terminal 102 and a terminal 106. With zero volts on terminal 182 of the tuner frequency controller 101, that apparatus is arranged to produce a ramp voltage output, i.e., the voltage at terminal 236 becomes more positive as a function of time. This ramp voltage output is coupled to a terminal 17 of an oscillator 16 of a UHF tuner 12 and to a terminal 19 of an oscillator 18 of a VHF tuner 14. As the voltage on terminal 236 becomes more positive, the frequency of the oscillator 18 increases (oscillator 16 being operational only when sweeping the UHF band). A sample of the oscillator signal existing at a terminal 50 of the oscillator 18 is coupled to a terminal 52 of a bandstart detector 44.

Within the bandstart detector 44, (see FIG. 2) oscillator signals appearing at the terminal 52 are coupled to a first tuned circuit 404 which has a predetermined resonant frequency spaced from the beginning of the lowest band to be tuned (e.g., approximately 8 MHz less than the industry standard oscillator frequency required to tune U.S. channel 2) and a second tuned circuit 406 which has a resonant frequency which is spaced from the beginning of a second band to be tuned (e.g., approximately 2 MHz less than the industry standard oscillator frequency required to tune U.S. channel 7). As the frequency of the oscillator 18 increases with increasing voltage at the terminal 236 of the tuner frequency controller 101, an operating condition is reached at which substantial coincidence occurs between the frequency of oscillator 18 and the resonant frequency of the first tuned circuit 404 or second tuned circuit 406. A first peak detector diode 440 or a second peak detector diode 446 coupled to the tuned circuit 404 or to the tuned circuit 406, as the case may be, develops a voltage which is inversely related to the difference between the frequency of oscillator 18 and the resonant frequency of the tuned circuit 404 or 406, respectively. This voltage is supplied to an amplifier 428 and a resultant voltage is coupled to a terminal 45 of the bandstart detector 44 which, for example, becomes more positive when substantial coincidence occurs.

Referring again to FIG. 1, the voltage change at the terminal 45 of the bandstart detector is coupled to a terminal 98 of the bandstart latch 97 to reset bandstart latch 97. Bandstart latch 97, in turn, provides a signal at terminal 96 to enable gate 93 and thereby provide for signal flow between the terminals 92 and 94 of gate 93.

The terminal 52 of the bandstart detector 44 is also coupled to a terminal 54 of the bandstart detector 44, which is coupled to a terminal 56 of the channel 5 and 6 calibration frequency translator 58. When counter 118 has not yet received pulses at a terminal 116 which would advance the count from the "00" count, the signal at terminal 56 is directly coupled to a terminal 60 of the channel 5 and 6 calibration frequency translator 58. The signal appearing at the terminal 60 is coupled to a terminal 62 of a mixer/beat frequency amplifier 32. A harmonic generator 26, which is arranged to generate reference signals spaced apart by a normal channel spacing (e.g., 6 MHz), couples such reference signals via a terminal 28 to a terminal 30 of the mixer beat frequency amplifier 32. Signals existing at the terminals 30 and 62 of the mixer/beat frequency amplifier 32 are mixed, filtered and amplified and the resultant beat or difference frequency appears at a terminal 64. The terminal 64 is coupled to a terminal 66 of the beat frequency discriminator 68 where the beat or difference 15 compared to a predetermined frequency range. If the beat frequency is greater than the predetermined frequency range, a first condition (e.g., zero voltage) appears at a terminal 74. If the beat frequency is less than the predetermined frequency range, a second voltage condition (e.g., a positive voltage) appears at terminal 74. A change in voltage (a pulse) therefore appears at terminal 74 each time the oscillator 18 is swept through the predetermined frequency range.

Pulses appearing at terminal 74 are coupled to terminal 92 of the gate 93 either by an inverting gate 78 (during VHF reception) or a noninverting gate 82 (during UHF reception). Signals existing at terminal 92 are coupled via the gate 93, the gate 103, and a noise integrator 112 to terminal 116 of the counter 118. As the frequency of the oscillator 18 increases and pulses are generated at the terminal 74 of the beat frequency discriminator 68, the counter 118 will provide an output at a terminal 120 which more nearly equates to the data stored in the selected channel memory 148 with each pulse. When the data in the counter 118 equals the data in the selected channel memory 148, the count comparator 162 produces a voltage transition at a terminal 166 of the count comparator 162. The voltage transition on the terminal 166 sets the hold latch 170 and creates a predetermined voltage (e.g., positive) on the terminal 174 of the hold latch 170. With such voltage on the terminal 174, the tuner frequency controller stops sweeping the voltage at the terminal 236 and the gate 103 inhibits the flow of signals between terminal 102 and the terminal 106.

When channel 5 or channel 6 is selected by the channel selector switches 142, and the counter 118 has reached a count of "05" or "06", respectively, (VHF oscillator 18 at 119 or 125 MHz, respectively), the channel 5 and 6 calibration frequency translator 58 reduces the frequency of the signal at the terminal 56 by a particular amount (e.g., by 52 MHz) and the resultant difference frequency is coupled to the terminal 60. This nonuniform treatment of the signal at terminal 56 is made necessary by the fact that the oscillator frequencies normally used for the reception of U.S. channels 5 and 6 are not related to harmonics of the 6 MHz harmonic generator in the same manner as other VHF channels.

If high band VHF channels (7–13) are selected by the channel selector switches 142, the tuner bandswitching system 178 causes the tuner 12 to switch from low band VHF to high band VHF after the counter 118 has accumulated six pulses. If UHF has been selected by the channel selector switches 142, tuner bandswitching system 178 subsequently switches from high band VHF to UHF when the counter 118 has accumulated 13 pulses. When the tuner bandswitching system 178 switches from one band to the next, the bandswitch reset pulse occurring at the terminal 200 resets the tuner frequency controller 101 thereby resetting the bandstart latch 97 and resetting the voltage at the terminal 236 to an initial condition.

When tuning signals in the UHF band, the oscillator 16 is varied in frequency by means of the voltage applied to terminal 17 in much the same way as the oscillator 18 is varied in frequency during VHF signal reception. A sample of the oscillator signal existing at a terminal 34 is coupled via a terminal 36 to a buffer amplifier 38. The buffer amplifier 38 reduces the coupling of 6 MHz harmonic signals into the oscillator 16 thereby reducing interference in the UHF tuner 12. An amplified version of the sample oscillator signal from oscillator 16 exists at a terminal 40 and is coupled to the bandstart detector 44 via terminal 42. A tuned circuit 402 within the bandstart detector 44 is coupled to terminal 42 and has a resonant frequency spaced from (e.g., approximately 2 MHz less than) the industry standard UHF oscillator frequency required to tune channel 14. The tuned circuit 402 and associated detectors 418, 420 produces a pulse at a terminal 45 at the beginning of the UHF band in the same manner as pulses were produced at terminal 45 at the beginning of the tuning of the low VHF band and the high VHF band.

Figure 2:
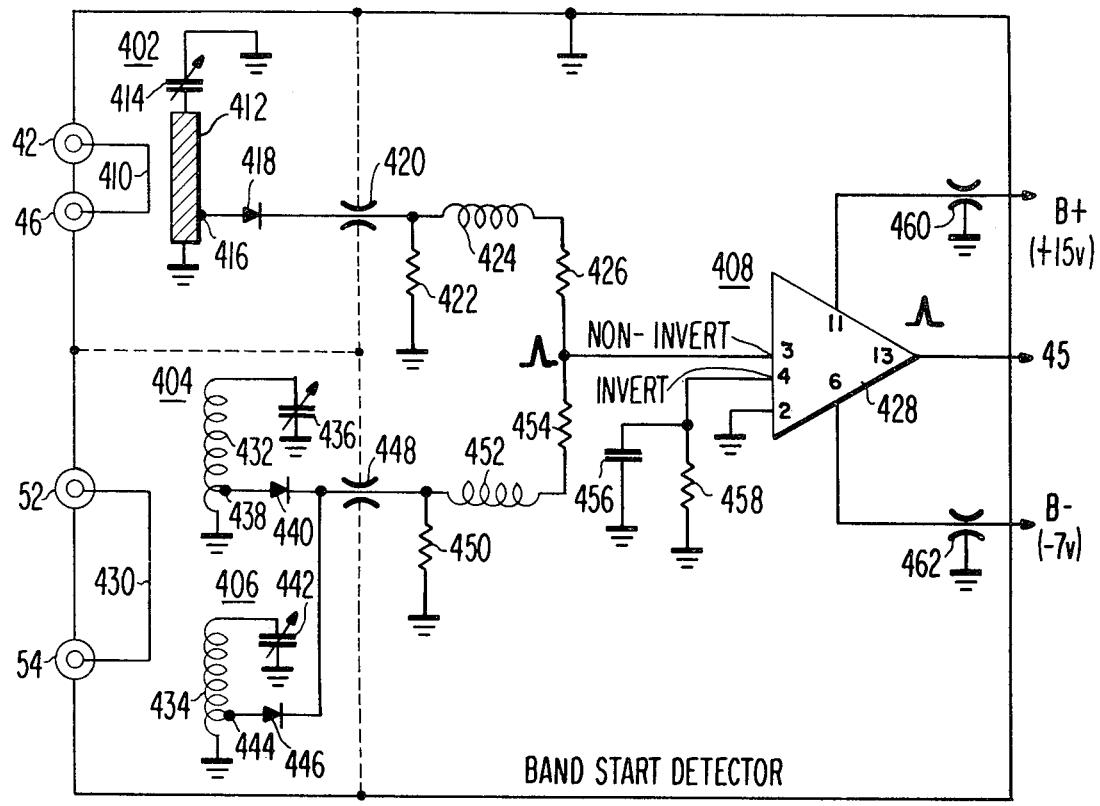
FIG. 2 illustrates in schematic form a bandstart detector arrangement.

Referring to the detailed schematic of FIG. 2, bandstart detector 44, illustrated in block form in FIG. 1, comprises a UHF bandstart resonant circuit 402, a low band VHF bandstart resonant circuit 404, a high band VHF bandstart resonant circuit 406 and a pulse amplifier 408.

An input inductor 410 is coupled between terminals 42 and 46 and is inductively coupled to transmission line inductor 412. A variable capacitor 414 is coupled across inductor 412. A tap 416 on inductor 412 is coupled to the anode of a diode 418, the cathode of which is coupled to the isolated terminal of a feedthrough capacitor 420. The other terminal of the feedthrough capacitor 420 is coupled to reference potential. A resistor 422 is coupled from the isolated terminal of the feedthrough capacitor 420 to reference potential. Capacitor 420 is also coupled by means of an RF choke 424 in series with a resistor 426 to a noninverting input terminal 3 of an integrated circuit operational amplifier 428 (e.g., the commercial type designated µA710 manufactured by Fairchild Corporation).

An input inductor 430 coupled between terminals 52 and 54 is inductively coupled to an inductor 432 and an inductor 434. A variable capacitor 436 is coupled across inductor 432. A tap 438 on inductor 432 is coupled to the anode of a detector diode 440. A variable capacitor 442 is coupled across inductor 434. A tap 444 on inductor 434 is coupled to the anode of a detector diode 446. The cathode of detector diode 440 and the cathode of detector diode 446 are coupled to the isolated terminal of a feedthrough capacitor 448. The other terminal of feedthrough capacitor 448 is coupled to reference potential. A resistor 450 is coupled between the isolated terminal of feedthrough capacitor 448 and reference potential. Capacitor 448 also is coupled via an RF choke 452 in series with a resistor 454 to the terminal 3 of the operational amplifier 428.

An inverting input terminal 4 of operational amplifier 428 is coupled to reference potential by means of a parallel combination of a capacitor 456 and a resistor 458. B+ is coupled to terminal 11 of operational amplifier 428 and the terminal 11 is bypassed by reference potential by means of a feedthrough capacitor 460. B− is coupled to a terminal 6 of operational amplifier 428 and is bypassed to reference potential by means of a feedthrough capacitor 462. A terminal 2 of operational amplifier 428 is coupled to reference potential and a terminal 13 is coupled to an output terminal 45.

In operation, a sample of the VHF oscillator signal coupled to terminal 52 is fed via the input inductor 430 to the inductor 432 and the inductor 434. As the tuner frequency controller 101 (FIG. 1) supplies the ramp voltage to VHF tuner 14, the frequency of the VHF oscillator signal increases and approaches the resonant frequency of the series combination of inductor 432 and variable capacitor 436. The signal lever at tap terminal 438 also starts to increase and is rectified by means of the peak detector diode 440 to provide a charge accumulation on the feedthrough capacitor 448. The voltage at tap terminal 438 reaches a maximum positive level when the oscillator sample is at the resonant frequency of the series combination of inductor 432 and the variable capacitor 436. As the frequency of the VHF oscillator signal increases further, the voltage at the tap terminal 438 starts to decrease and the voltage on the feedthrough capacitor 448 is discharged by means of resistor 450.

The amplifier 428 is a relatively high voltage gain arrangement which is responsive to input signals above a predetermined threshold level (e.g., 20mv volts peak) but is relatively non-responsive to signals below that level. Thus, as the voltage increases on feedthrough capacitor 448, a point is reached where due to the exceedingly high gain of the operational amplifier 428 the voltage at terminal 45 switches from approximately zero volts to approximately B+ potential.

The bandstart latch 97 (see FIG. 1) is therefore set and gate 93 is enabled to provide for a coupling of pulses from beat frequency discriminator 68 to counter 118.

When a high VHF band channel is selected, enabling of the gate 93 occurs 8 MHz below the industry standard oscillator frequency for channel 2 and a disabling of the gate 93 occurs after the counter accumulates six counts. It should be noted that, since there is no channel 1 in the U.S., the illustrated bandstart detector is separated sufficiently from the channel 2 oscillator frequency so that pulses are supplied to the counter which correspond with channels being tuned. The gate 93 must be re-enabled by a positive voltage transition at terminal 45 of bandstart detector 44 at 2 MHz below the industry standard oscillation frequency required to tune channel 7. A similar disabling and re-enabling cycle of gate 93 must occur twice when a UHF band channel is selected, i.e., at 2 MHz below the industry standard oscillation frequencies required to tune channels 7 and 14. These disabling and re-enabling cycles are required to accumulate a count in the counter equal to the channel member being tuned because of the discontinuity in the radio frequency band channel allocations.

What is claimed is:

1. In a television tuning system which provides for the selection of any one of a plurality of television channels in at least a first band of radio frequencies where access to said one channel is accomplished by a sweeping of an oscillator of a tuner through at least a second band of frequencies and where said one channel is identified by comparing a signal from said oscillator with a plurality of harmonically related signals within said second band of frequencies and accumulating in a counter a count representative of the number of predetermined frequency comparisons between said oscillator signal and said harmonically related signals encountered during a period of sweeping of said oscillator, a system for initiating counting by said counter, comprising:

first means coupled to said oscillator for developing a control signal having a magnitude representative of a frequency difference between said signal from said oscillator and a frequency selected in predetermined relationship to said second band of frequencies, said first means comprising a resonant circuit tuned to said frequency selected in predetermined relationship to said second band of frequencies and adapted to be coupled to said oscillator, a unilateral conducting device having a first terminal coupled to said resonant circuit and a second terminal, and means coupled to said second terminal of said unilateral conducting device for the development of said control signal, said resonant circuit being tuned to a frequency between said harmonically related signals and separated in frequency from said second band of frequencies by less than one frequency spacing of said harmonically related signals;

second means coupled to said first means and responsive to said control signal for providing a first output when said control signal magnitude is less than a threshold value and for providing a second output when said control signal magnitude is greater than said threshold value; and means coupling said second means to said counter for conditioning said counter for operation upon a transition between said first and said second output.

2. In a television tuning system which provides for the selection of any one of a plurality of television channels in at least a first band of radio frequencies where access to said one channel is accomplished by a sweeping of an oscillator of a tuner through at least a second band of frequencies and where said one channel is identified by comparing a signal from said oscillator with a plurality of harmonically related signals within siad second band of frequencies and accumulating in a counter a count representative of the number of predetermined frequency comparisons between said oscillator signal and said harmonically related signals encountered during a period of sweeping of said oscillator, a system for initiating counting by said counter, comprising:

first means coupled to said oscillator for developing a control signal having a magnitude representative of a frequency difference between said signal from said oscillator and a frequency selected in predetermined relationship to said second band of frequencies, said first means comprising a resonant circuit tuned to said frequency selected in predetermined relationship to said second band of frequencies and adapted to be coupled to said oscillator, unilateral conducting device having a first terminal coupled to said resonant circuit and a second terminal, and means coupled to said second terminal of said unilateral conducting device for the development of said control signal, said resonant circuit being tuned to a frequency between said harmonically related signals and separated in frequency from said second band of frequencies by less than two and greater than one frequency spacing of said harmonically related signals;

second means coupled to said first means and responsive to said control signal for providing a first output when said control signal magnitude is less than a threshold value and for providing a second output when said control signal magnitude is greater than said threshold value; and means coupling said second means to said counter for conditioning said counter for operation upon a transition between said first and said second output.

3. In a television tuning system which provides for the selection of any one of a plurality of television channels in at least a first and a second band of radio frequencies where access to said one channel is accomplished by a sweeping of an oscillator of a tuner through at least a third and a fourth band of frequencies and where said one channel is identified by comparing a signal from said oscillator with a plurality of harmonically related signals within said third and said fourth band of frequencies and accumulating in a counter a count representative of the number of predetermined frequency comparisons between said oscillator signal and said harmonically related signals encountered during a period of sweeping of said oscillator, a system for initiating counting by said counter, comprising:

first means coupled to said oscillator for developing a control signal having a magnitude representative of a frequency difference between said signal from said oscillator and a first frequency selected in predetermined relationship to said third band of frequencies, said first and second means comprising a first resonant circuit tuned to said first frequency selected in predetermined relationship to said third band of frequencies and adapted to be coupled to said oscillator, a first unilateral conducting device having a first terminal coupled to said resonant circuit and a second terminal, and means coupled to said second terminal of said unilateral conducting device for the development of said control signal;

second means coupled to said oscillator for developing a control signal having a magnitude representative of a frequency difference between said signal from said oscillator and a second frequency selected in predetermined relationship to said fourth band of frequencies, said second means comprising a second resonant circuit tuned to said second frequency selected in predetermined relationship to said fourth band of frequencies and adapted to be coupled to said oscillator, and a second unilateral conducting device having a first terminal coupled to said resonant circuit and a second terminal coupled to said means for the development of said control signal, said second resonant circuit being tuned to a frequency between said harmonically related signals and said first resonant circuit being tuned to a frequency separated from said third band of frequencies by less that two and greater than one frequency spacing of said harmonically related signals and said second resonant circuit being tuned to a frequency separated from said fourth band of frequencies by less than one frequency spacing of said harmonically related signals.

* * * * *

UNITED STATES PATENT OFFICE
CERTIFICATE OF CORRECTION

PATENT NO. : 3,961,263

DATED : June 1, 1976

INVENTOR(S) : John Barrett George

It is certified that error appears in the above-identified patent and that said Letters Patent are hereby corrected as shown below:

Column 4, line 23, before "compared" change "15" to -- is --

Column 6, last line, change "member" to -- number --

Column 7, line 54, change "siad" to -- said -- line 70, before "unilateral" insert -- a --.

Signed and Sealed this

Thirty-first Day of August 1976

Attest:

RUTH C. MASON
*Attesting Officer*

C. MARSHALL DANN
*Commissioner of Patents and Trademarks*